United States Patent [19]

Omae et al.

[11] Patent Number: 5,764,793

[45] Date of Patent: Jun. 9, 1998

[54] METHOD OF AND APPARATUS FOR INSPECTING PATTERN DEFECTS

[75] Inventors: Takao Omae; Isao Teramae; Tetsuo Sano, all of Fushimi-Ku, Japan

[73] Assignee: Dainippon Screen Mfg. Co., Ltd., Japan

[21] Appl. No.: 580,879

[22] Filed: Dec. 29, 1995

[30] Foreign Application Priority Data

Jan. 6, 1995 [JP] Japan .................. 7-000721

[51] Int. Cl.$^6$ .................................. G06K 9/32
[52] U.S. Cl. .................. 382/149; 382/151; 382/294
[58] Field of Search .................. 382/144, 145, 382/147, 148, 149, 150, 151, 222, 294, 141–143; 437/8; 348/126, 92, 93, 129; 364/468.17; 356/390, 394, 237; 250/559.05, 559.06, 559.7, 559.8, 6, 7, 8, 559.39, 559.41, 559.46

[56] References Cited

U.S. PATENT DOCUMENTS

| | | | |
|---|---|---|---|
| 4,701,859 | 10/1987 | Matsuyama et al. | 364/490 |
| 4,805,123 | 2/1989 | Specht et al. | 364/559 |
| 4,893,346 | 1/1990 | Bishop | 382/147 |
| 4,894,790 | 1/1990 | Yotsuya | 382/147 |
| 5,054,097 | 10/1991 | Flinois et al. | 382/44 |
| 5,125,040 | 6/1992 | Matsui et al. | 382/144 |

Primary Examiner—David K. Moore
Assistant Examiner—Brian P. Werner
Attorney, Agent, or Firm—Ostrolenk, Faber, Gerb & Soffen, LLP

[57] ABSTRACT

A defect inspection apparatus inspects a defect by a compare check method even if there is only one object substrate to be inspected. Further, if there are a plurality of object substrates to be inspected, the defect inspection apparatus corrects a reference pattern image in accordance with defect inspection using the compare check method. In application to a printed to wire board on which identical unit patterns are printed, unit patterns which are included in one row are defined as a mater area and the other unit patterns on the same printed wire board are defined as object areas. The master area is compared with each one of the object areas to thereby perform defect inspection. When there are a plurality of object substrates to be inspected, a pattern image is corrected utilizing results of comparison. By using a corrected pattern image as a master substrate image, defect inspection is performed on the other object substrates.

12 Claims, 14 Drawing Sheets

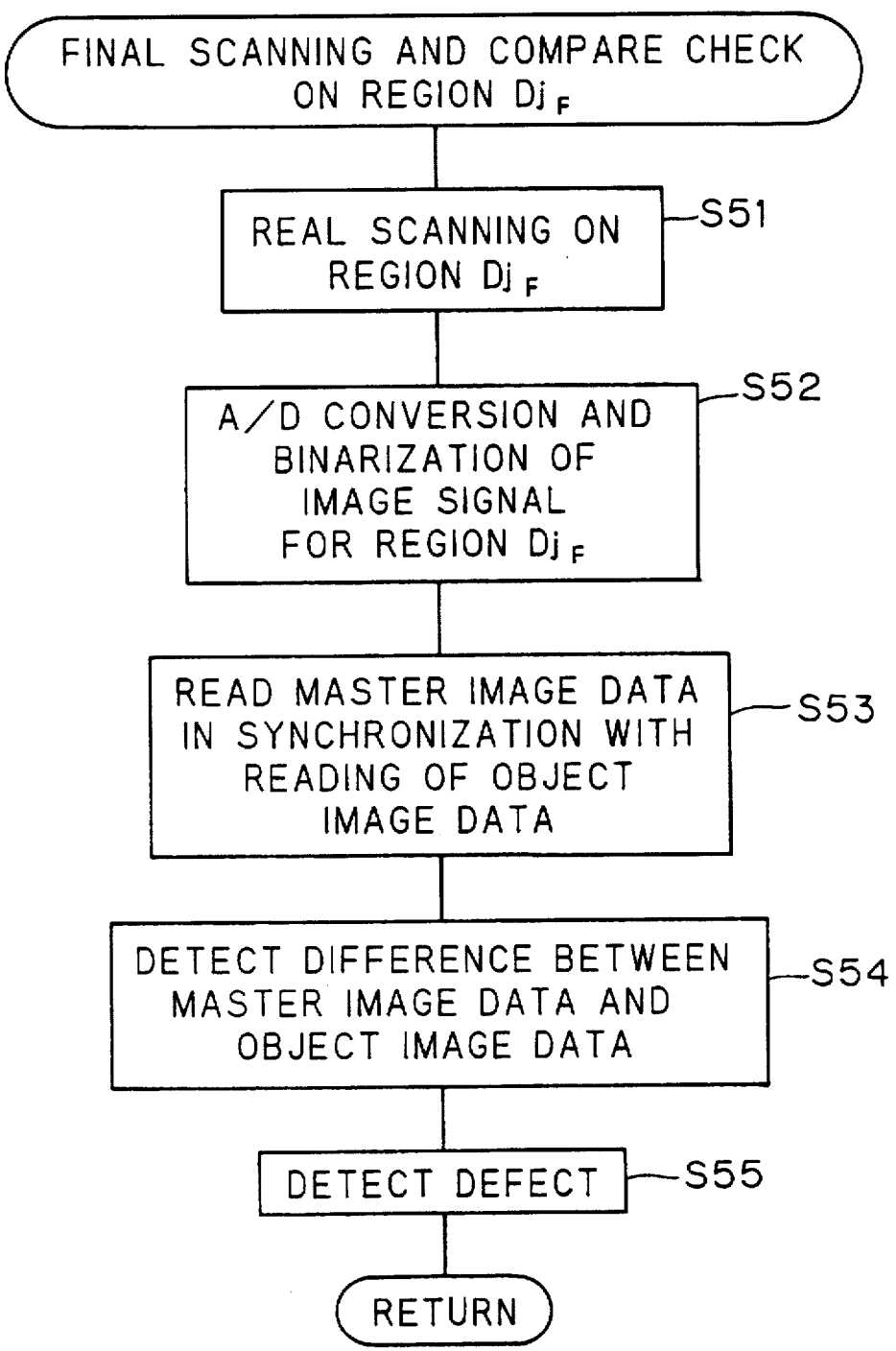

METHOD OF AND APPARATUS FOR INSPECTING PATTERN DEFECTS

BACKGROUND OF THE INVENTION

1. Field of the Invention

The present invention is related to a method of and an apparatus for inspecting a defect in a pattern which is formed on an inspection object such as a printed wired board, and more particularly, to a technique for enabling a compare check method even when a reference image to be compared with an image of an inspection object is not prepared to expand the application range of the compare check method.

2. Description of the Background Art

There are primarily two methods which are known as a method of inspecting a defect in a printed wired board, a mask pattern or the like. Namely, a compare check method (pattern matching method) and a design rule check method. In the former method, an image pattern which is used as a reference (i.e., a reference pattern image) and an image pattern which is to be inspected for a defect (i.e., an object pattern image) are overlapped one atop the other and a defect is identified based on a difference between the two. This defect inspection method is disclosed in JP-A-592,069 and JP-A-6,061,604, etc. In the latter method, various features included in a reference pattern image (e.g., line width, angle, particular pattern) are stored in advance, and if an object pattern image includes a pattern which does not correspond to those features, a portion of such a pattern is determined as a defect. This defect inspection method is disclosed in JP-A-57,149,905, etc.

Of these methods, it is necessary in the former comparison method to obtain a reference pattern image in advance by some method prior to inspection of a defect. While CAD data or the like can be used as a reference pattern image instead of obtaining a reference pattern image from an object, this requires much labor and time. Therefore, in general, of a plurality of objects, one with relatively a few defects is selected and a reference pattern image is obtained based on the selected object. Alternatively, the selected object itself is used as a reference pattern image.

However, when only one object is available for the comparison method above, it is impossible to obtain a reference pattern image. The comparison method can not be performed in this case.

Even if there are a plurality of objects, since a reference pattern image is selected from the objects, there is no guarantee that the selected reference pattern image does not include any defect at all. Although this makes it necessary to inspect the reference pattern image for a defect and correct a defect if any, there is nothing which can be used as a reference to be compared with the reference pattern image. To deal with this, the reference pattern image is inspected by the design rule check method mentioned above and a defect portion is corrected based on a result of the inspection to obtain a reference pattern image which will be actually used.

However, in the design rule check method mentioned, if a portion of a pattern is completely lacked, e.g., if a pattern includes a large defect, the lacked portion fails to be inspected as a defect. Hence, correction of the reference pattern image by this method alone is insufficient.

That is, these two types of problems share a common characteristic that the causes of the problems are the absence of a reference image to be compared with an object. Due to this, the accuracy of defect inspection is deteriorated.

SUMMARY OF THE INVENTION

The present invention is directed to a method of inspecting pattern defects of an object on which a plurality of unit patterns are arrayed.

According to the present invention, the method comprises the steps of: a) reading the plurality of unit patterns to obtain a plurality of unit pattern images; b) designating at least one of the plurality of unit pattern images to obtain: a reference image consisting of the at least one of the plurality of unit pattern images, and an object image consisting of unit pattern images other than the reference image among the plurality of unit pattern images; and c) comparing the object image with the reference image to inspect the pattern defects of the object.

When an object on which a plurality of identical patterns are printed is inspected for a defect by a compare check method, according to the first aspect of the present invention, defining images of some unit patterns as a reference pattern image and defining images of the other unit patterns as object pattern images, the object pattern images are compared with the reference pattern image, whereby defect inspection is performed. Hence, it is possible to perform defect inspection by a compare check method even if there is no reference image which is to be compared with an object, that is, even if there is only one object, or if there are a plurality of objects and a reference object itself needs be inspected.

According to an aspect of the present invention, in particular, when an image of an object is obtained row by row on a matrix arrangement of unit patterns while moving one-dimensional image reading apparatus relative to the object, for example, if unit patterns included in one row are defined as a reference pattern, it is not necessary to separate the reference pattern from object patterns in one row. It is also unnecessary to classify and store, that is, to re-organize the stored image data, namely, the reference and the object patterns. As a result, inspection is performed efficiently.

According to another aspect of the present invention, when there are a plurality of objects, a compare check method is used for defect inspection on an object which is used as a reference. Hence, a more accurate reference pattern image is obtained easily, which in turn improves the accuracy of defect inspection on other objects of the same type.

Accordingly, it is a first object of the present invention to provide for a defect inspection apparatus with which it is possible to inspect a defect in an object by a comparison method even when there is no reference image to be compared with an object.

A second object of the present invention to correct an image of an object which is selected to be used as a reference among a plurality of objects, in accordance with defect inspection which is performed by a comparison method, and thereby to improve the accuracy of inspection of a defect in other objects of the same type.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a flow chart showing a sequence of processes for defect inspection on a forward side inspection region of a master substrate by means of a compare check method.

DESCRIPTION OF THE PREFERRED EMBODIMENTS

1. Outline of A Preferred Embodiment

An apparatus according to a preferred embodiment of the present invention is adapted to inspect of pattern defects on a printed wire board, wherein a conductive pattern on the printed wire board is formed by printing a plurality of the same type of unit patterns. Some unit patterns on the printed wired board to be inspected are used as a reference pattern image. Thus, it is possible to inspect a defect by a compare check method.

Figure 1:
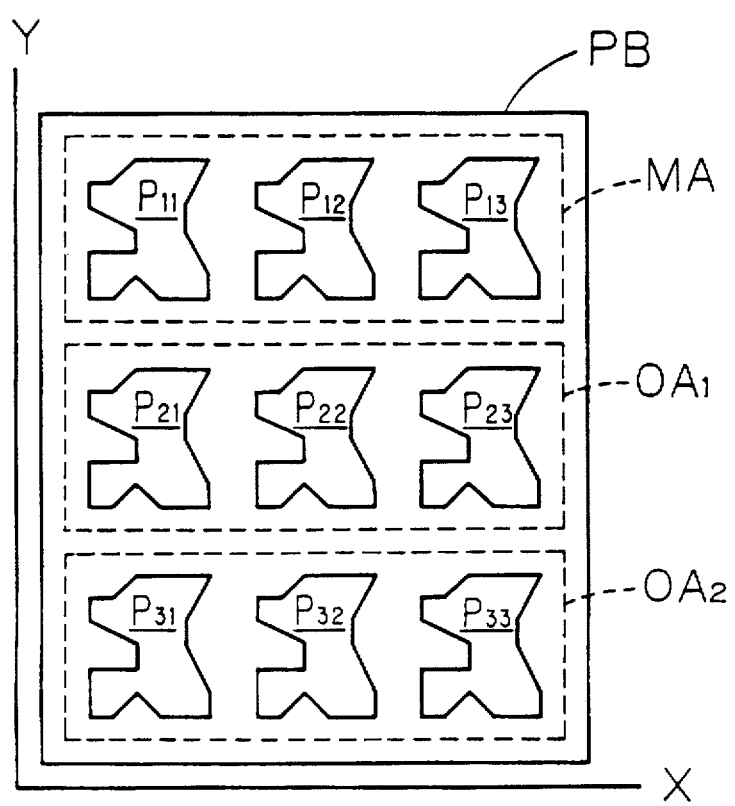
FIG. 1 is a conceptual view showing an example of allotting a master area and object areas according to a preferred embodiment of the present invention.

As shown in FIG. 1, a plurality of unit patterns $P_{11}$ to $P_{33}$ are arranged in a printed wired board PB, a set unit patterns $P_{11}$, $P_{12}$ and $P_{13}$ are included in one row is defined as a master pattern (a reference pattern), and the unit patterns ($P_{21}$, $P_{22}$, $P_{23}$) and ($P_{31}$, $P_{32}$, $P_{33}$) included in the other rows on the printed wired board PB are defined as object patterns (object pattern images). These patterns are compared with each other to perform defect inspection.

In FIG. 1, three unit patterns are included in each row, and the printed wire board PB consists of three such rows which in total include nine unit patterns. The three unit patterns in the top row in FIG. 1 are used as a master pattern, and the top row is defined as a master area MA. The patterns included in the other rows are defined as object patterns. The second row is defined as a first object area $OA_1$ and the third row is defined as a second object area $OA_2$. In the illustrated example, the master area MA is compared with the first object area $OA_1$ and with the second object area $OA_2$ to conduct defect inspection. Thus, even if there is only one printed wired board for which defect inspection is required, it is possible to execute defect inspection.

In FIG. 1, the designation X and Y denote scanning directions for scanning, which will be described later. The direction X corresponds a main scanning direction, and the direction Y corresponds to a sub scanning direction.

In the present embodiment, an arrangement of unit patterns in the X direction is referred to as "row", and an arrangement of patterns in the Y direction is referred to as "column." It is to be noted, however, that "rows" and "columns" are terms defined relative to each other. In reality, in FIG. 1 as well, if the printed wire board is turned around 90 degrees, "rows" and "columns" are replaced with each other. Therefore, which arrangement is defined as "rows" is optional.

Figure 2:
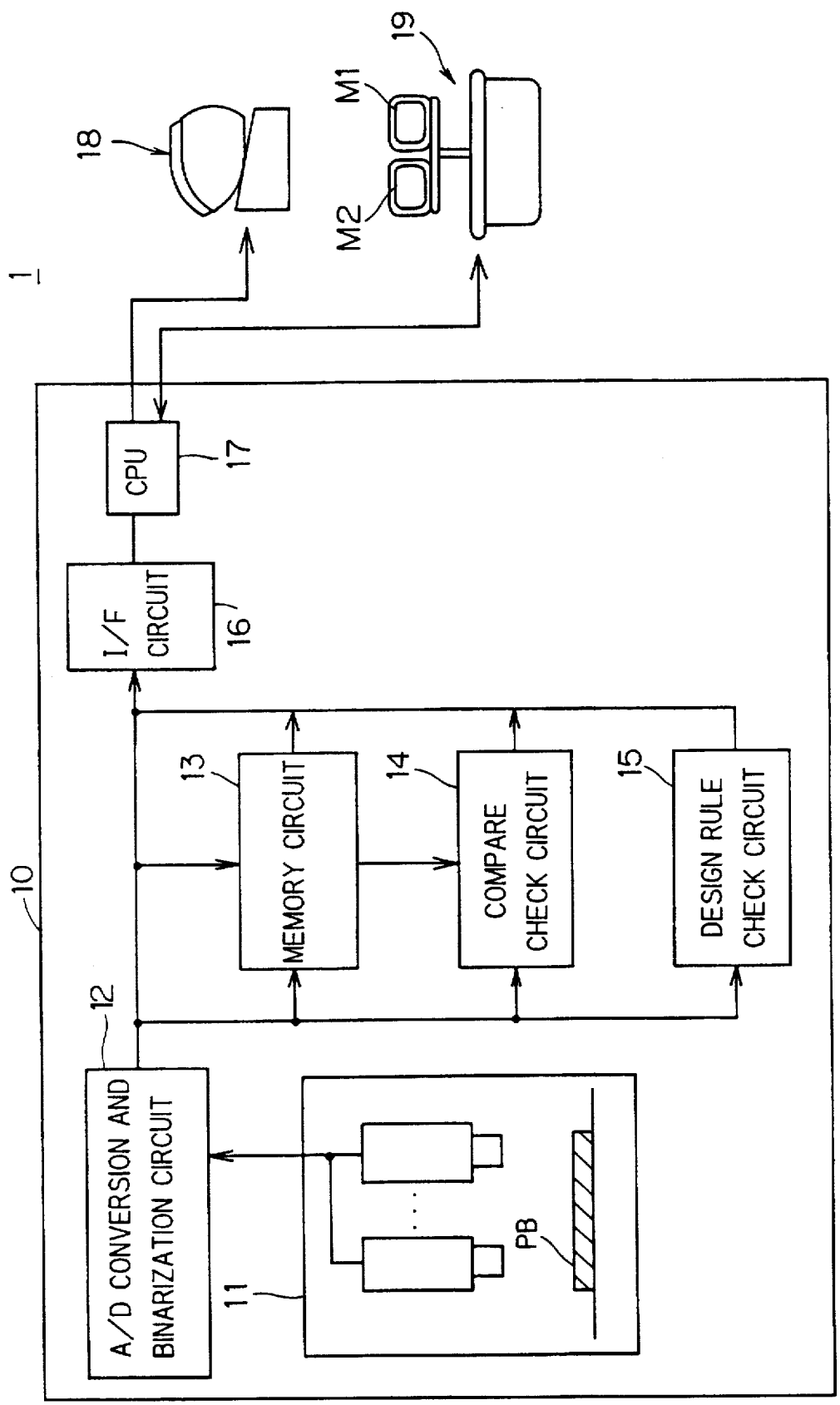
FIG. 2 is a block diagram of a defect inspection apparatus according to the preferred embodiment.

FIG. 2 is a block diagram showing a structure of the apparatus according to the present embodiment. The defect inspection apparatus 1 includes an image reading apparatus 11 for reading an image of the printed wire board PB and an A/D conversion and binarization circuit 12 for digitalizing and binarizing an analog image signal which is obtained by reading. The apparatus 1 also includes a memory circuit 13 for storing a binarized signal (hereinafter "binary data") and the like, a compare check circuit 14 for performing defect inspection on an object image (object pattern image) out of the binary data by a comparison method, a design rule check circuit 15 for performing defect inspection on the binary data by a design rule check method (hereinafter "DRC inspection"), an I/F circuit 16 for controlling transfer of various data, and a CPU 17 which serves as an operation processing unit for performing various data processing. These elements form a object image controlling apparatus 10. Regarding processes which are performed in accordance with flow charts which will be described later, if the subject which performs a process is not specified, the process is by means of software which is operated by the CPU 17.

Further, a graphic terminal 18 is used for displaying a pattern image and for receiving various types of inputs from an operator. A verify station 19 is used to correct a master image (reference pattern image) which is found to include a defect.

2. Sequence of Processes in the Preferred Embodiment

A sequence of processes of the apparatus according to the present embodiment is described with reference to a flow chart shown in FIG. 3. This example applies to the case where a plurality of the same type of printed wire boards are used as object substrates, and one of the printed wire boards to be inspected is selected as a reference substrate. However, it is possible to perform inspecting in accordance with the flow chart even if there is only one printed wire board.

First, at Step S1, the image reading apparatus 11 shown in FIG. 2 pre-scans a printed wired board PB which is selected as a reference substrate (hereinafter "master substrate").

Figure 4:
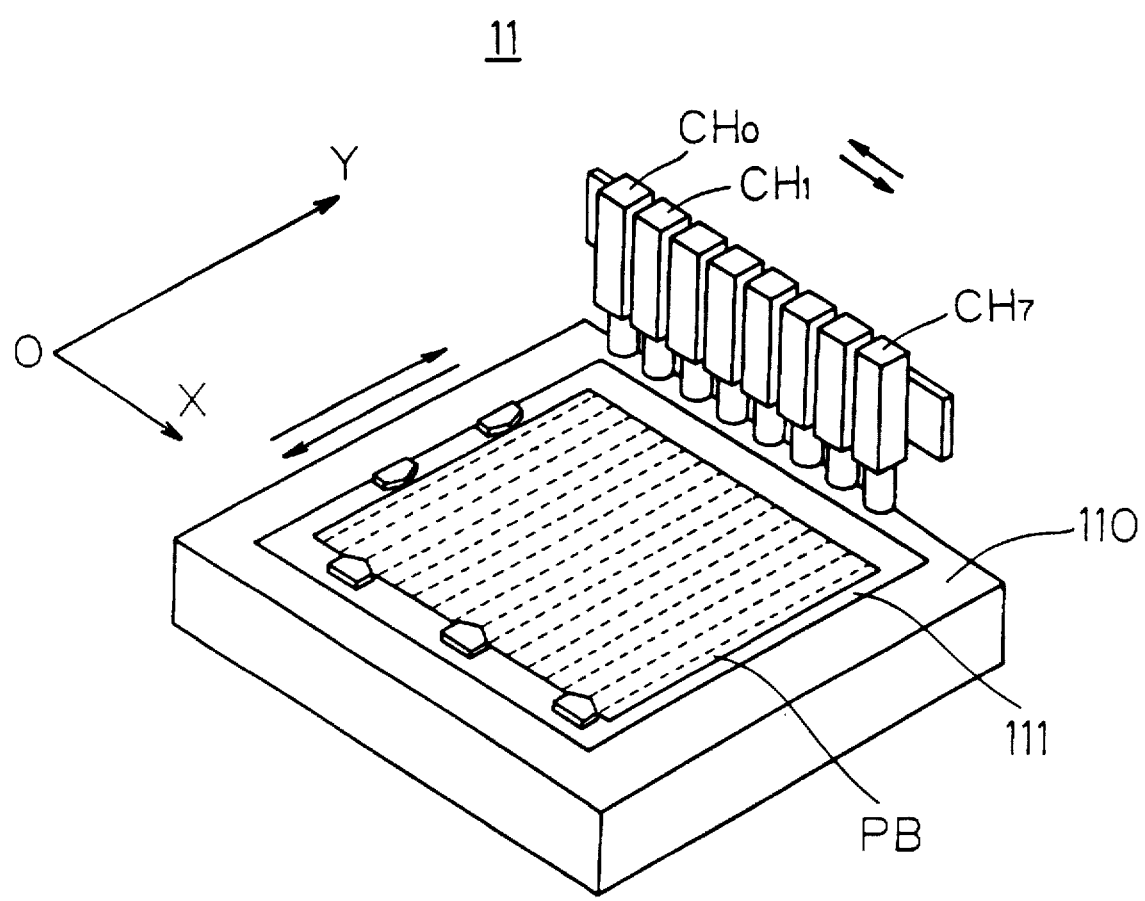
FIG. 4 is a perspective view of an image reading apparatus according to the preferred embodiment.
Figure 5:
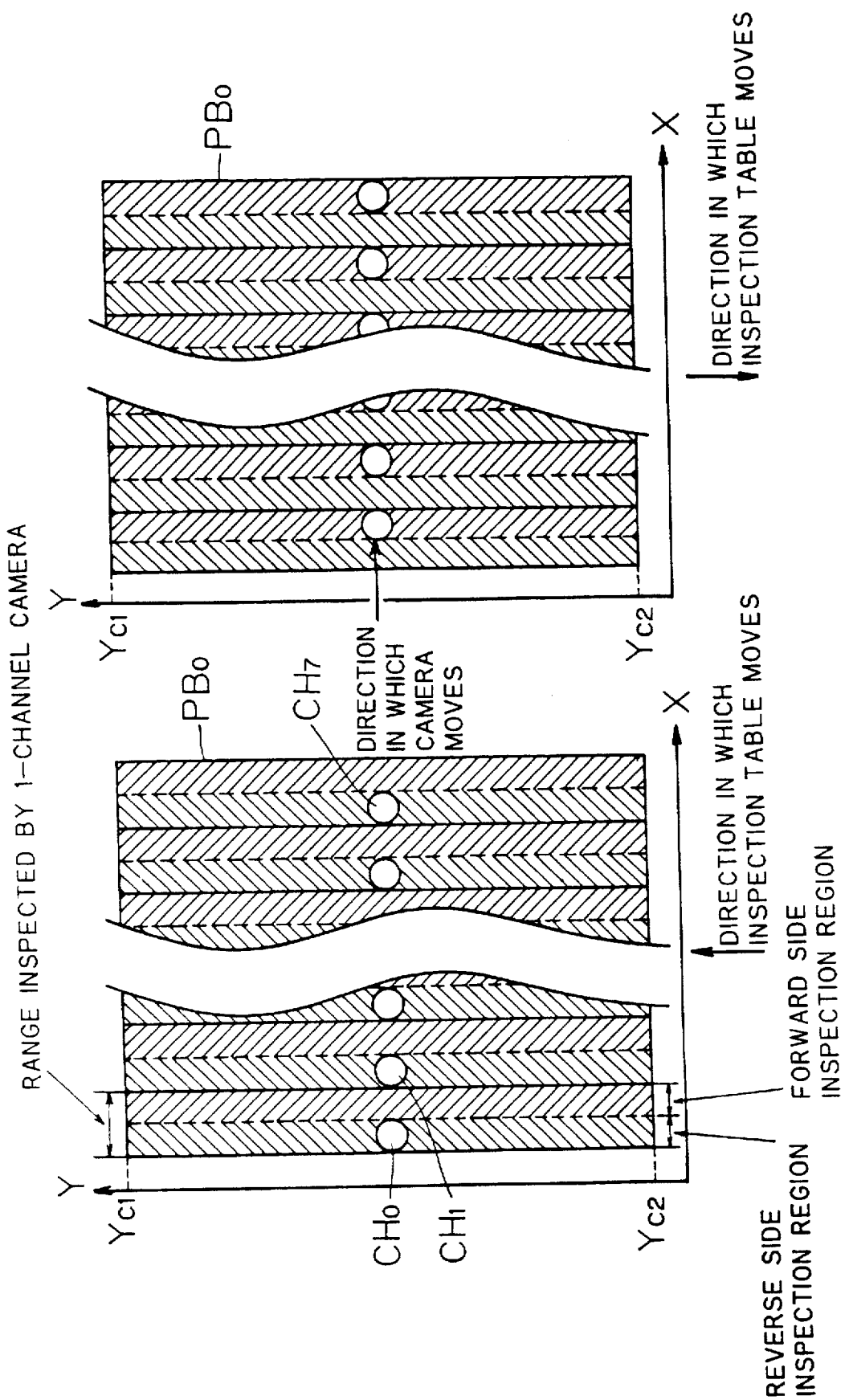
FIG. 5 is an explanatory diagram for describing an operation of cameras and an inspection table during pre-scanning in the preferred embodiment.

FIG. 4 shows in general the image reading apparatus 11. The image reading apparatus 11 reads, at the same time, time patterns on the printed wire board PB, using eight cameras $CH_0$ to $CH_7$ which are arranged in a line. Although not shown in FIG. 4, each one of the cameras $CH_0$ to $CH_7$ is linked to a reflection light source, and a transmission light source is disposed within a check table 110. A substrate mounting transparent plate 111 is placed on a top surface of check table 110. The check table 110 can move in the Y direction with the printed wire board PB mounted thereon. Furthermore, the cameras $CH_0$ to $CH_7$ can move in the X direction with the distances therebetween maintained, within a predetermined width range. Each one of the cameras $CH_0$ to $CH_7$ includes a one-dimensional image sensor which elongates in a direction which is optically equivalent to the X direction. The cameras $CH_0$ to $CH_7$ scan an image while the check table 110 is moved in the Y direction, and thus the printed wire board PB mounted on the substrate mounting transparent plate 111 is scanned. In FIG. 4, dotted lines on the printed wire board PB correspond to each reading width of a reciprocal scanning, which will be described later. No linear patterns defined by such lines are formed on the substrate in reality. FIG. 5 shows effective read image ranges $PB_0$ on the printed wire board PB which are read by the cameras $CH_0$ to $CH_7$, and a sequence of scanning of the effective read image ranges $PB_0$. In FIG. 5, hatched portions with lines slanted upwardly toward the right side are regions which the cameras $CH_0$ to $CH_7$ read during forward scanning, and hatched portions with lines slanted downwardly toward the right side are regions which the cameras $CH_0$ to $CH_7$ read during reverse scanning. The cameras $CH_0$ to $CH_7$ are fixed to a driving apparatus with the same distances between cameras as reading widths of cameras $CH_0$ to $CH_7$.

During scanning, cameras $CH_0$ to $CH_7$ each start scanning from an end portion $YC_1$ of the forward side inspection region shown in FIG. 5, thereby reading a pattern image of the forward side inspection region in a negative Y-direction.

Forward scanning is completed upon arrival of the cameras $CH_0$ to $CH_7$ at the position of the other end portion $YC_2$. At the same time, the cameras $CH_0$ to $CH_7$ move the respective reading widths in a positive X-direction. Next, the cameras $CH_0$ to $CH_7$ start scanning in the positive Y-direction while reading. Pre-scanning is completed upon return of the cameras $CH_0$ to $CH_7$ at the end portion $YC_1$. This is the procedure executed at Step S1 of FIG. 3.

Figure 3:
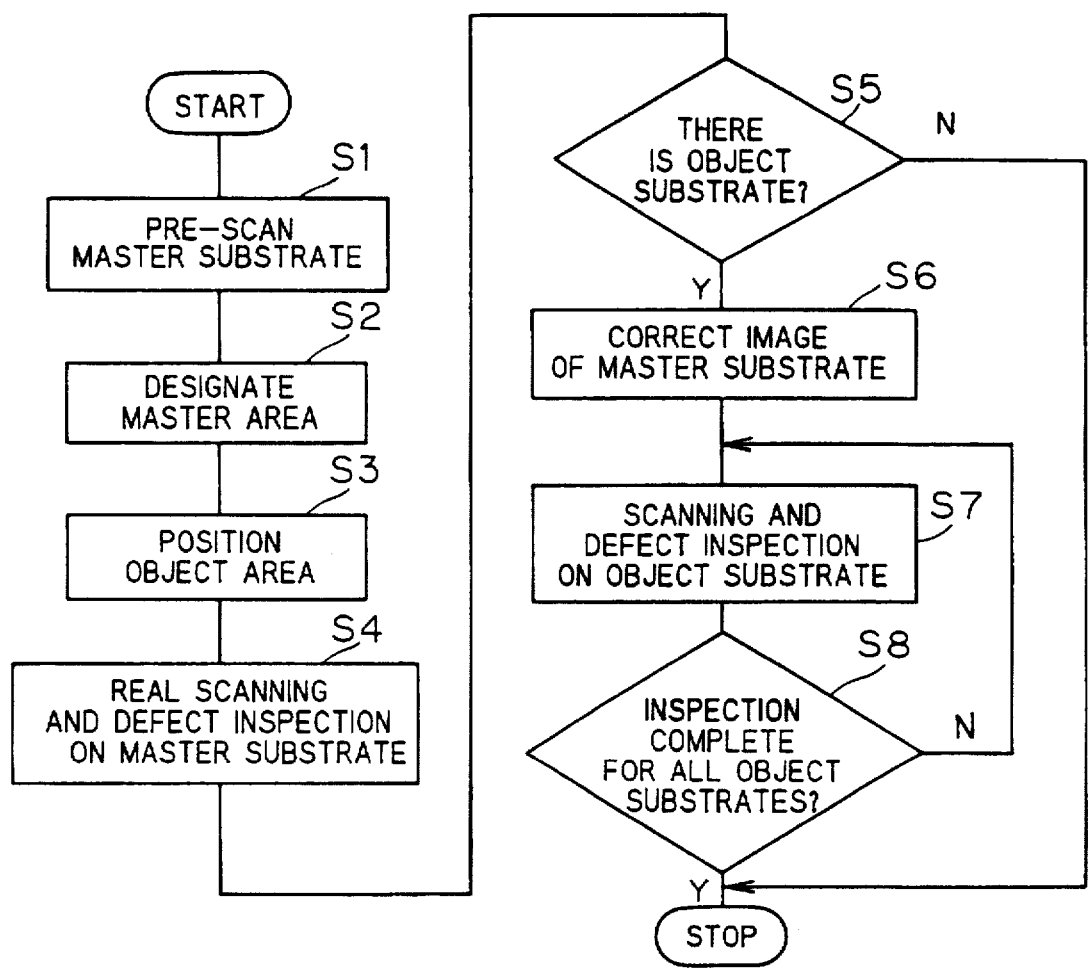
FIG. 3 is a flow chart showing a sequence of processes of the defect inspection apparatus according to the preferred embodiment.
Figure 6:
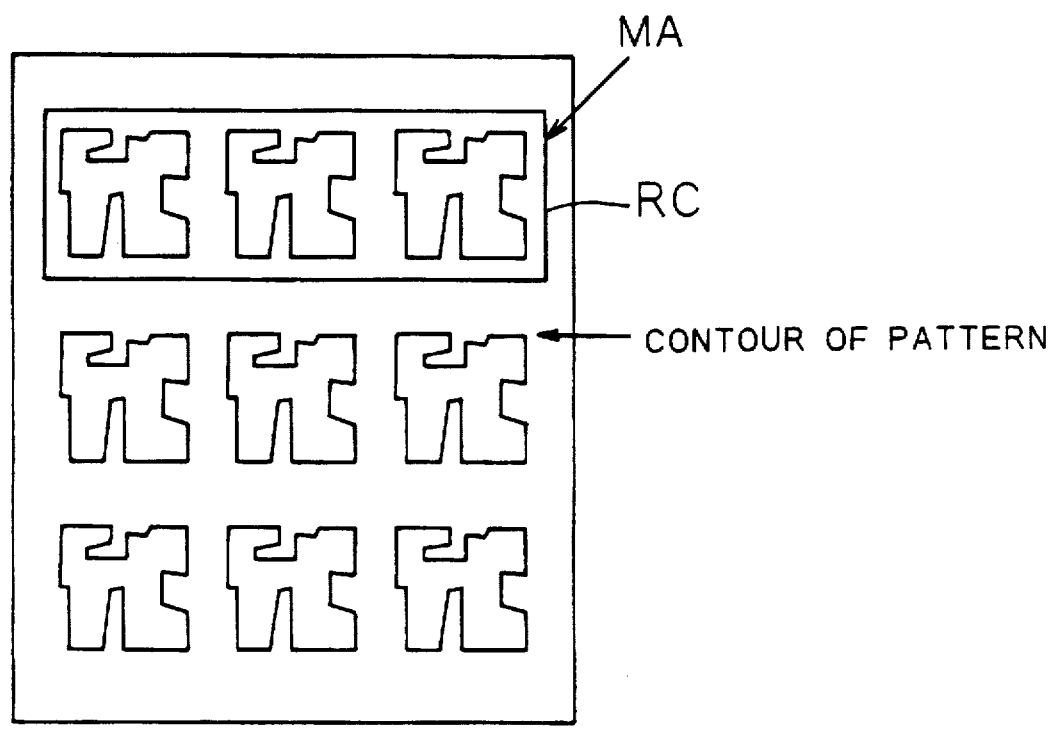
FIG. 6 is an explanatory diagram for describing the designation of a range of a master area in the preferred embodiment.

Referring to FIG. 3, at Step S2, a range of the master area MA is designated based on an image which is obtained by pre-scanning. FIG. 6 shows a state in which the range of the master area MA is designated on a screen of the graphic terminal 18. Pixels are thinned out in a pattern image of the printed wire board PB which was obtained by pre-scanning, whereby a binary image consisting of 1×1 pixels, which was reduced from 8×8 pixels (hereinafter "reduced binary image"), is displayed. Following this operation, an operator designates a rectangle RC which encloses a region defined as the range of the master area MA, using coordinate designating means such as a mouse. Data of the designated master area MA are stored in a memory of the CPU 17.

At Step S3 shown in FIG. 3, positional relationships between the master area MA and the object areas $OA_1$ and $OA_2$ are determined. Correct positional relationships between the respective areas must be determined for the purpose of compare checking since the printed wire board PB is not necessarily arranged parallel to X-axis and Y-axis of check table 110.

Figure 7:
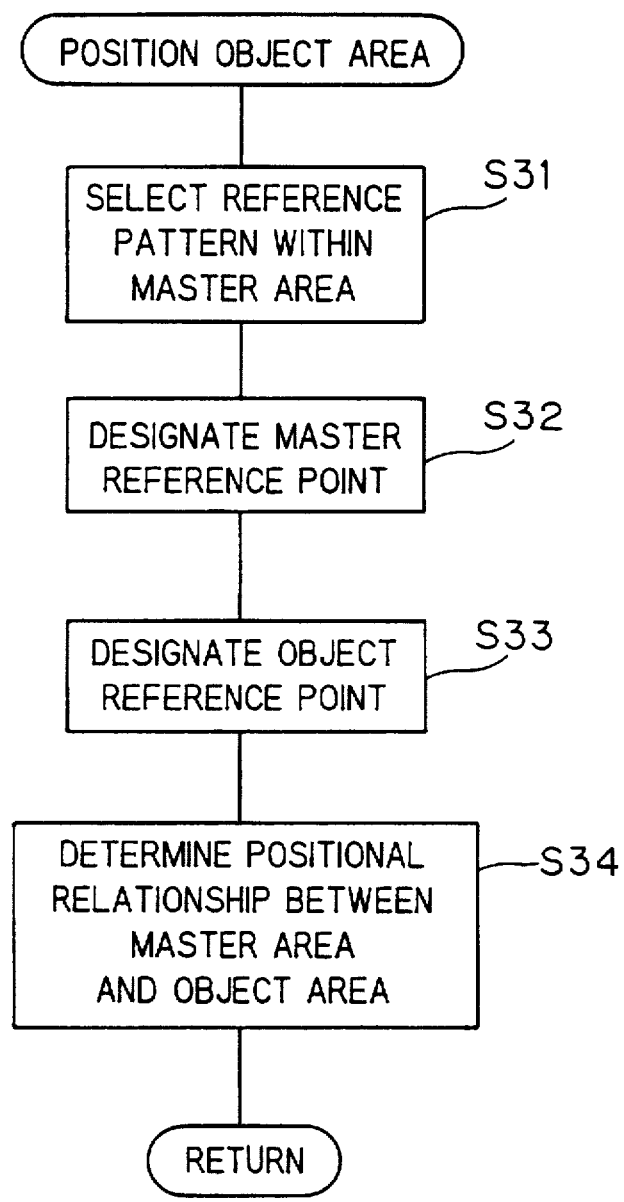
FIG. 7 is a flow chart showing a sequence of processes for positioning object areas in the preferred embodiment.
Figure 8:
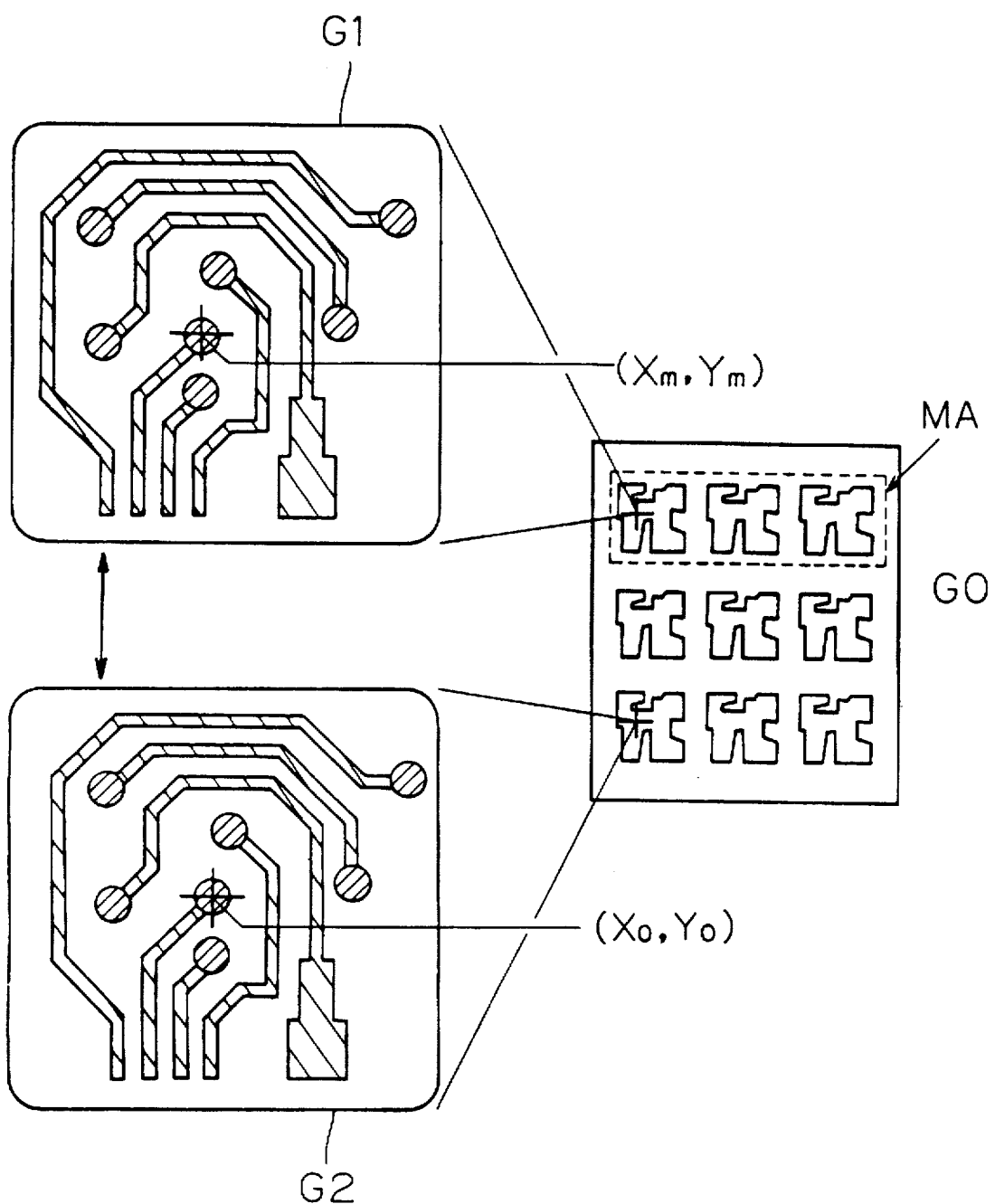
FIG. 8 is an explanatory diagram for describing the positioning of object areas in the preferred embodiment.

FIG. 7 is a flow chart showing the operation of positioning the object areas $OA_1$ and $OA_2$. FIG. 8 shows the relationships between the respective images during positioning. At Step S31 in FIG. 7, a characteristic pattern portion within the master area MA (hereinafter "characteristic pattern portion") is selected. Prior to this process, a reduced binary image G0 as that shown in FIG. 8, is displayed on the screen of the graphic terminal 18. At Step S31, an operator switches the screen display to a binary image of the master area MA as it is before thinning (hereinafter "original binary image"). Using the mouse, the displayed range of the pre-thinning binary image is moved, the characteristic pattern portion is selected, and an area around the characteristic pattern portion is displayed. FIG. 8 shows a pattern portion G1 as the characteristic pattern portion.

Next, at Step S32 in FIG. 7, a reference point (hereinafter "master reference point") is designated within the characteristic pattern portion G1. In this procedure an operator moves a cross-shaped cursor using the mouse and clicks at a desired position to determine the master reference point, as shown in FIG. 8. The memory which is within the CPU 17 stores coordinates $(X_m, Y_m)$ of the master reference point and data regarding the original binary image which is currently displayed.

At Step S33, a reference point within each object area which corresponds to the master reference point is designated (hereinafter "object reference point"). First, an operator returns the screen display back to the reduced binary image, moves a display position to the second object area $OA_2$ which is farthest from the master area MA, finds a pattern portion which corresponds to the characteristic pattern portion G1, and switches the screen display to an original binary image which is close to the pattern portion. The original binary image is overlapped on an image of a pattern portion G2 (See FIG. 8), and the original binary image, close to the pattern portion G1 which is stored in the memory of CPU 17, is displayed in a different color. The original binary image, which is close to the pattern portion G1, is then moved so as to determine a position at which the two patterns best overlap. Thus, a point which corresponds to the master reference point within the object area is detected as coordinates $(X_0, Y_0)$ of an object reference point. The memory of CPU 17 stores the coordinates $(X_0, Y_0)$.

Figure 9:
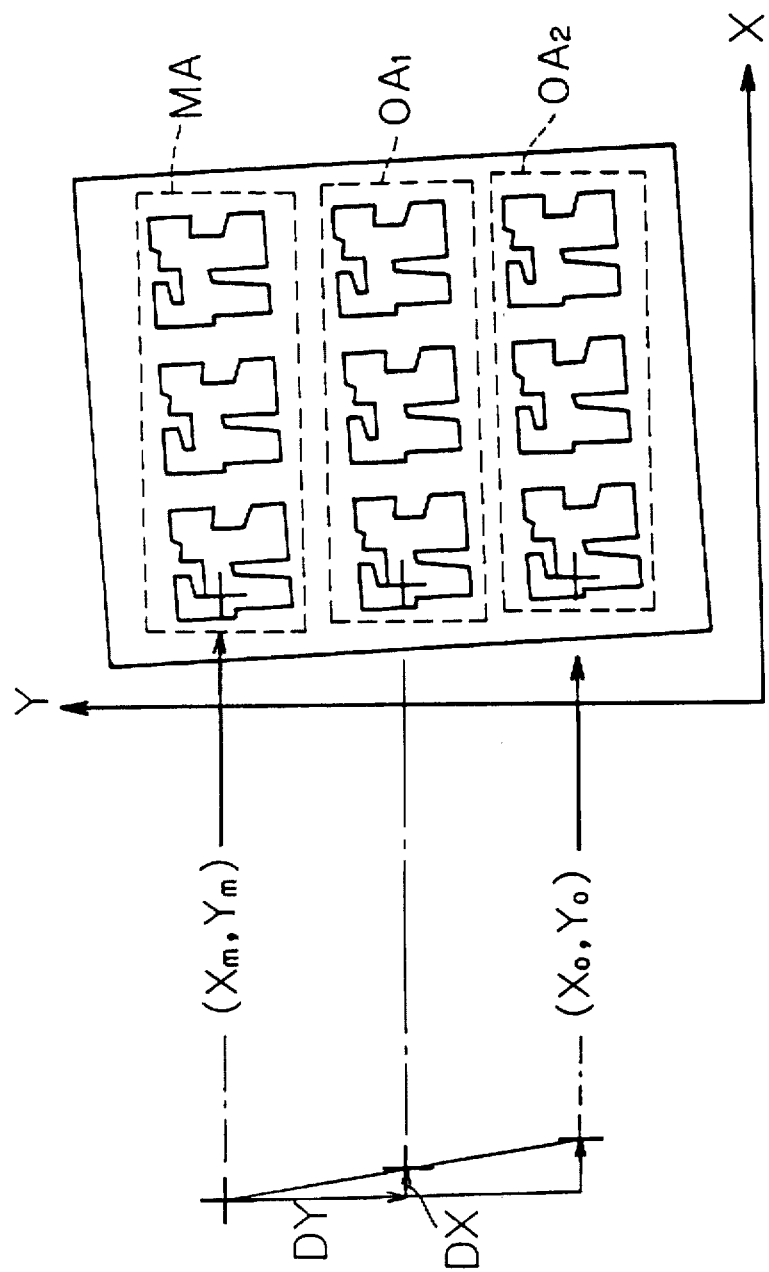
FIG. 9 is a conceptual view showing a positional relation of a master area and a first object area relative to each other in the preferred embodiment.

At Step S34, a positional relationship between the master area MA and each one of the object areas $OA_1$ and $OA_2$ is determined. That is, the coordinates $(X_m, Y_m)$ of the master reference point and the coordinates $(X_0, Y_0)$ of the object reference point stored in the memory of CPU 17 at Step S33 are read, and using these coordinates, the positional relationships between the master area MA and the object areas $OA_1$ and $OA_2$ are calculated by a linear interpolation method. Calculation of the positional relationships using the linear interpolation method is performed only when the total number of the master and the object areas included in the printed wire board PB is at least three, but is not performed when the total number is two or smaller. More precisely, a difference $(X_m-X_0, Y_m-Y_0)$ between the coordinates of the two reference points is divided with the number N of the object areas (N=2 in this example) to find the position (DX, DY) of the master area MA relative to the first object area $OA_1$, which is closest to the master area MA. FIG. 9 shows a relationship between the values DX and DY and the two reference points. As understood from FIG. 9, actual calculation is as follows:

$$DX=(X_0-X_m)/N$$

$$DY=(Y_0-Y_m)/N \quad (1)$$

The relative coordinates (DX, DY) express the position of the master area MA relative to the first object area $OA_1$ which is closest to the master area MA. Once the relative coordinates are found, the position of the master area MA relative to other object area is easily calculated. (Calculation to find such relative position will be described later.)

While the description above is related to the situation where the respective areas are evenly assigned, if the respective areas are not evenly assigned, a reference point must be found for each object area to calculate relative coordinates regarding each object area.

Figure 10:
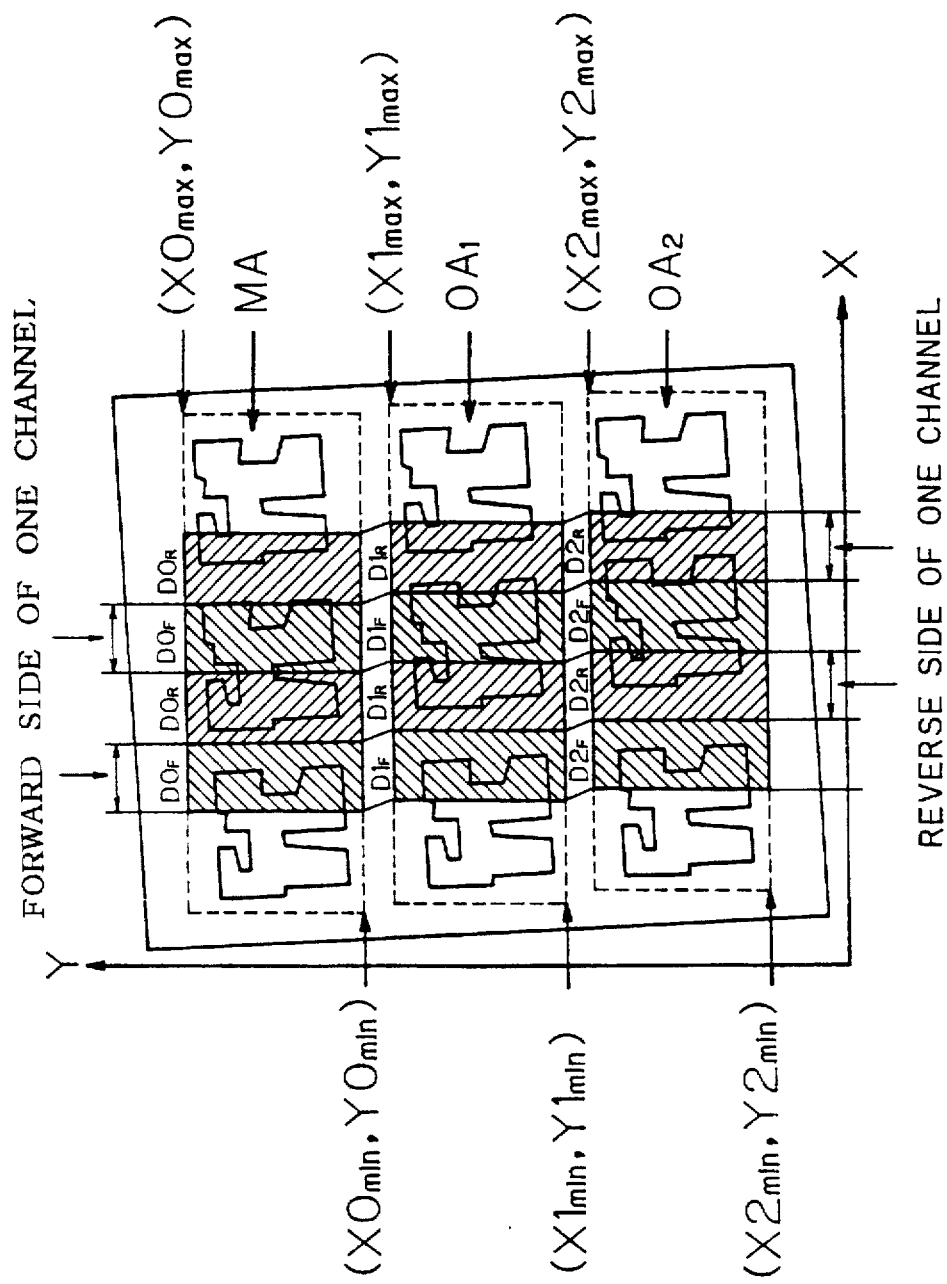
FIG. 10 is a conceptual view of real scanning and defect inspection on a master substrate in the preferred embodiment.

Based on information obtained as a result of the steps described above, at Step S4 shown in FIG. 3, real scanning and defect inspection are performed on the printed wire board PB. FIG. 10 shows real scanning. It is assumed that j=0, 1, and 2 with respect to the description set forth below regarding FIG. 10. The master area MA is expressed as j=0, the first object area $OA_1$ is expressed as j=1, and the second object area $OA_2$ is expressed as j=2. In FIG. 10, portions $Dj_F$ with lines slanted up toward the right side) comprise a scanning region which the cameras $CH_0$ to $CH_7$ scan during forward scanning, while portions $Dj_R$ (with lines slanted downwardly toward the right side) comprise a scanning region which the cameras $CH_0$ to $CH_7$ scan during reverse scanning. Coordinate values $(Xj_{min}, Yj_{min})$ designate the bottom left-hand corner of each area, and a coordinate values $(Xj_{max}, Yj_{max})$ designate the top right-hand corner of each area. When j=0, a coordinate value denoting the range of the master area is the value which is stored in the memory of the CPU 17 at Step S2 FIG. 3), when the master area MA is designated. When j=1 or j=2, using the relative coordinates (DX, DY) calculated at Step S4 FIG. 3), the coordinate value denoting the range of the object area is calculated as:

$$Xjk = X0k + j \cdot DX$$

$$Yjk = Y0k + j \cdot DY$$

The letter k indicates min or max. Thus, a difference between pre-scanning and real scanning is that the entire printed wire board PB is scanned parallel while the printed wire board PB is scanned parallel area by area while shifting the position of the printed wire board PB stepwise in the X direction and correcting inclination.

Figure 11:
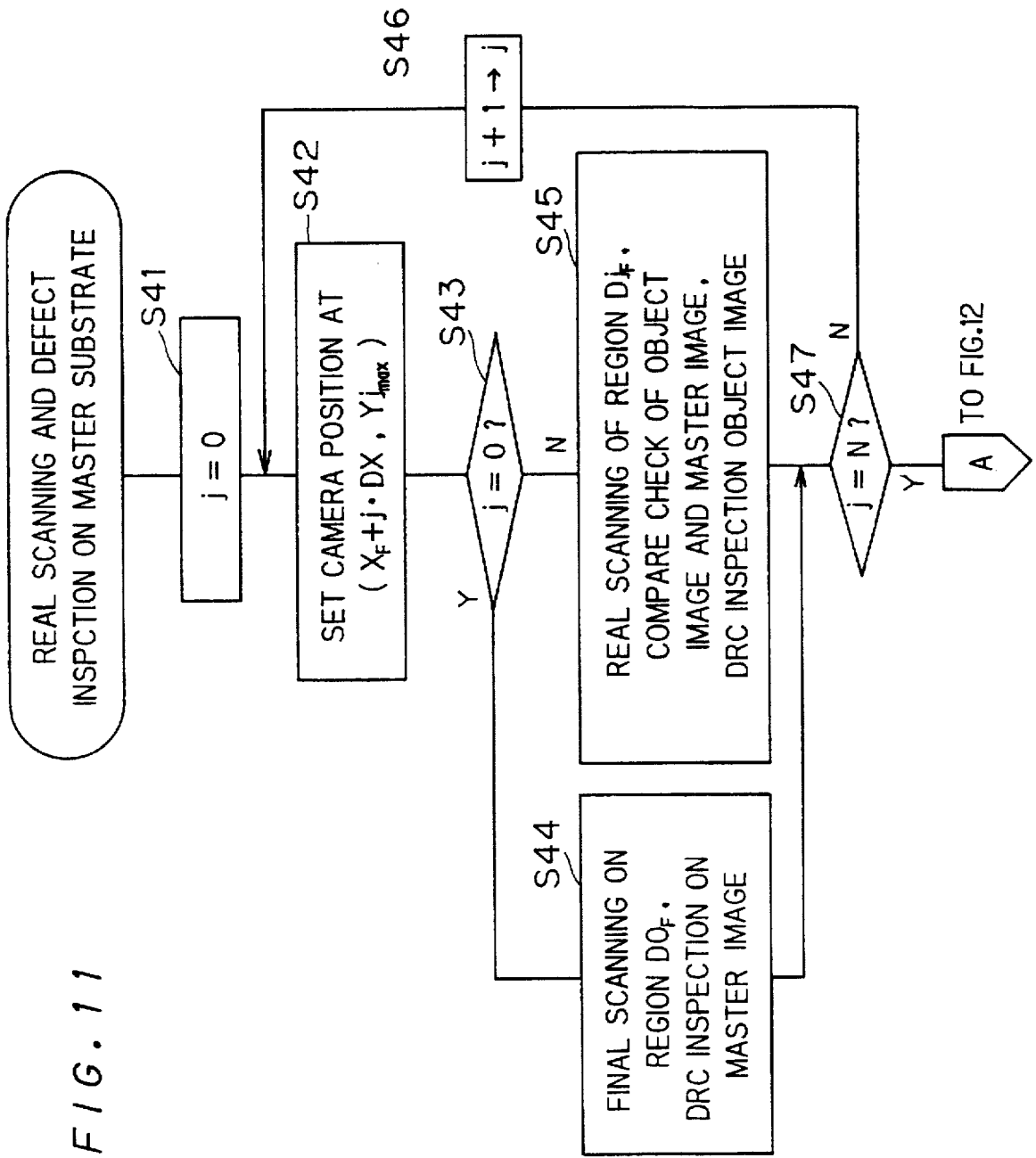
FIG. 11 is a flow chart showing a sequence of processes for real scanning and defect inspection on a forward side inspection region of a master substrate in the preferred embodiment.
Figure 12:
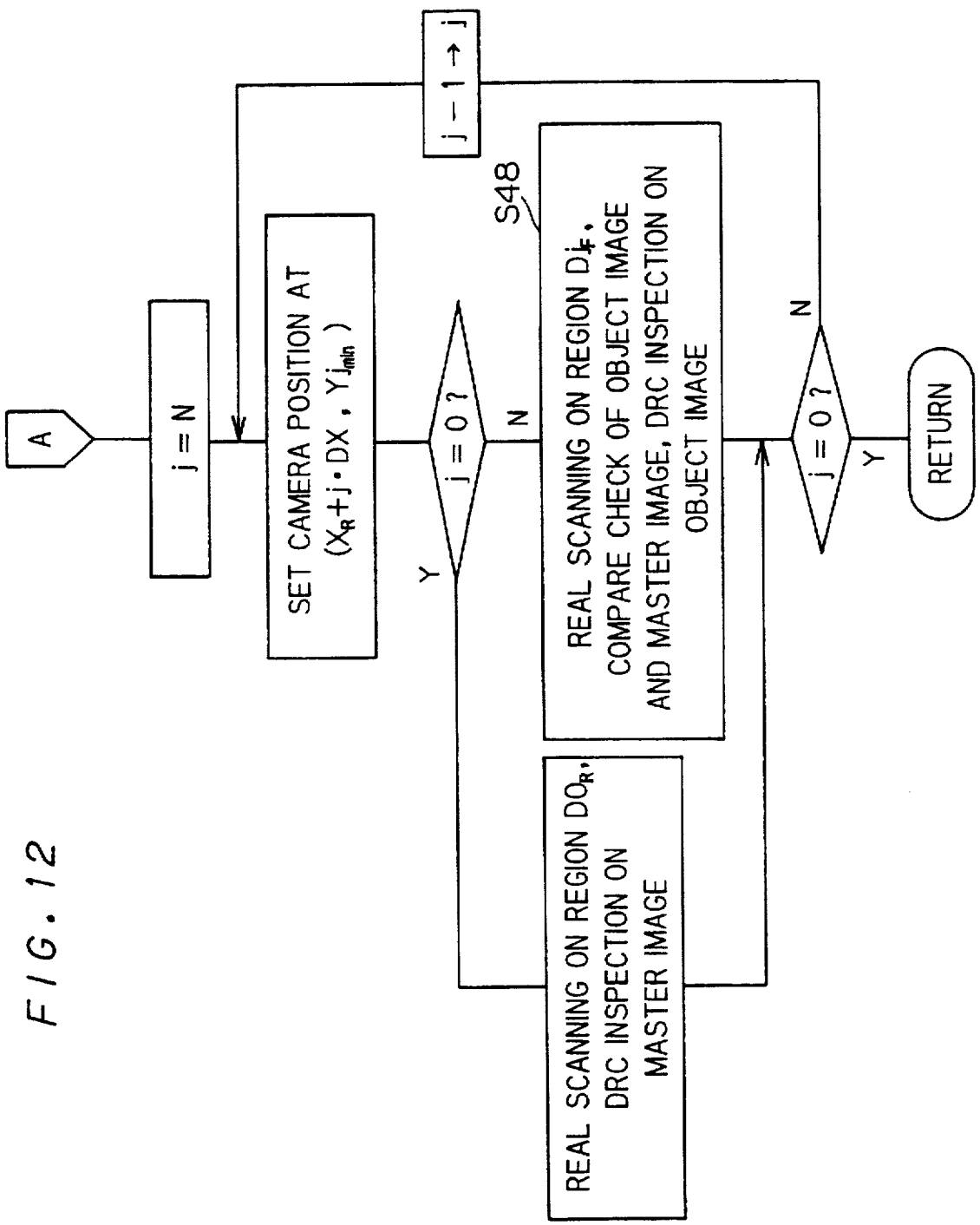
FIG. 12 is a flow chart showing a sequence of processes for real scanning and defect inspection on a reverse side inspection region of a master substrate in the preferred embodiment.

A detailed description follows concerning a sequence of processes for real scanning and compare check of Step S4 (FIG. 3), while referring to the flow charts of FIGS. 11 and 12. FIG. 11 shows a sequence of processes for scanning a forward side inspection region of each area shown in FIG. 10, and FIG. 12 shows a sequence of processes for scanning a reverse side inspection region of each area shown in FIG. 10. In FIGS. 11 and 12, $X_F$ and $X_R$ are X-coordinates of a camera position in the forward side inspection region and the reverse side inspection region of the master area, respectively, and DX is the value which is yielded by Eq. (1). The letter N expresses the number of the object areas (N=2 in this example) as previously described. The other symbols are the same as those used in FIG. 10.

It is determined that j=0 at Step S41, since scanning of a forward side inspection region starts from the master area side in the negative Y-direction. Next, at Step S42, the eight cameras are moved to an end positive Y-direction of the forward side inspection region of each area which corresponds to the value j. At Step S43, different processes are executed depending on whether the area to be scanned is the master area MA, or the object area $OA_1$ or $OA_2$. When the area to be scanned is the master area MA, real scanning and DRC inspection are performed on the forward side inspection region at Step S44. Conversely, when the area to be scanned is the object area $OA_1$ or $OA_2$, real scanning is performed on the forward side inspection region, the object image is compared with the master image, and DRC inspection is performed on the object image. Next, at Step S47, different processes are executed depending on whether a defect check on the forward side inspection regions of both object areas $OA_1$ and $OA_2$ is complete. If the check is not complete, the value j is incremented and real scanning and DRC inspection are performed on the next object area at Step S46. If the check is complete, scanning and defect inspection are performed on a reverse side inspection region as shown in FIG. 12.

The processing on a reverse side inspection region shown in FIG. 12 is similar to the processing shown in FIG. 11. A difference is that a reverse side inspection region is processed from the negative Y-side to the positive Y-side, whereas a forward side inspection region is processed from the positive Y-side to the negative Y-side. To be more specific, the value of the parameter j becomes smaller by 1 from the value N for every process. Real scanning and compare check are performed on the master substrate in this manner.

Compare check of the object image and the master image is described in more details with reference to FIG. 13. FIG. 13 is a flow chart showing a sequence of processes for compare check of the forward side inspection region $Dj_F$. The series of processes expresses the sequence of real scanning of the region $Dj_F$ (j=1, 2) and the compare check of the object image and the master image at Step S45 shown in FIG. 11.

First, at Step S51, the image reading apparatus 11 performs real scanning on the region $Dj_F$. Since region $Dj_F$ is a forward side inspection region, it is scanned toward the negative Y-direction. Next, at Step S52, an image signal read from region $Dj_F$ is supplied to the A/D conversion and binarization circuit 12. The A/D conversion and binarization circuit 12 performs A/D conversion and binarization so that object image data are obtained which will then be supplied to the compare check circuit 14. In synchronization with this, at Step S53, reading of the master image data from the memory circuit 13 starts at an address which corresponds to the position $Y0_{max}$ shown in FIG. 10. At Step S54, the compare check circuit 14 calculates an exclusive OR (hereinafter "differential data") of the master image data and the object image data. At Step S55, a pixel operator of a predetermined size operates the differential data, pixels are determined as a defect if larger differential data are detected, and positional information regarding the data are supplied to the CPU 17 through I/F circuit 16. The processing at Step S45 is complete when these processes and DRC inspection of the object images for the entire region $Dj_F$ are finished. Although the process description referring to FIG. 13 is related to the region $Dj_F$, the processing is approximately similar to the processing at Step S48 on the region $Dj_R$ of FIG. 12. Differences are that the direction of scanning is in the positive Y-direction and that reading of the master image data starts at an address which corresponds to the position $Y0_{min}$.

Referring to Step S5 of FIG. 3, different processes are executed depending on whether there is one printed wire board or a plurality of printed wire boards to be inspected. Where a plurality of printed wire boards must be inspected, compare check is performed on other object substrates of the same type based on the master substrate. Hence, this process is a process for correcting the master substrate image at subsequent Step S6. If there is one printed wire board to be inspected, i.e., there is only the master substrate, confirmation of whether the master substrate includes a defect is sufficient, and therefore no further correction of the image of the master substrate is necessary.

If there are other object substrates to be inspected, the master substrate image is corrected at Step S6. An operator performs this correction using the verify station 19 which is shown in FIG. 2. That is, when defect inspection of the master substrate is finished, the screen of a monitor M1 of the verify station 19 displays the result of DRC inspection on the master area MA and, results of DRC inspection and compare check on the object areas $OA_1$ and $OA_2$. When an operator uses the mouse and designates a desired defect portion of the image identified by these results, an original binary image of the defect portion is displayed on the screen of monitor M1.

Figure 14A:
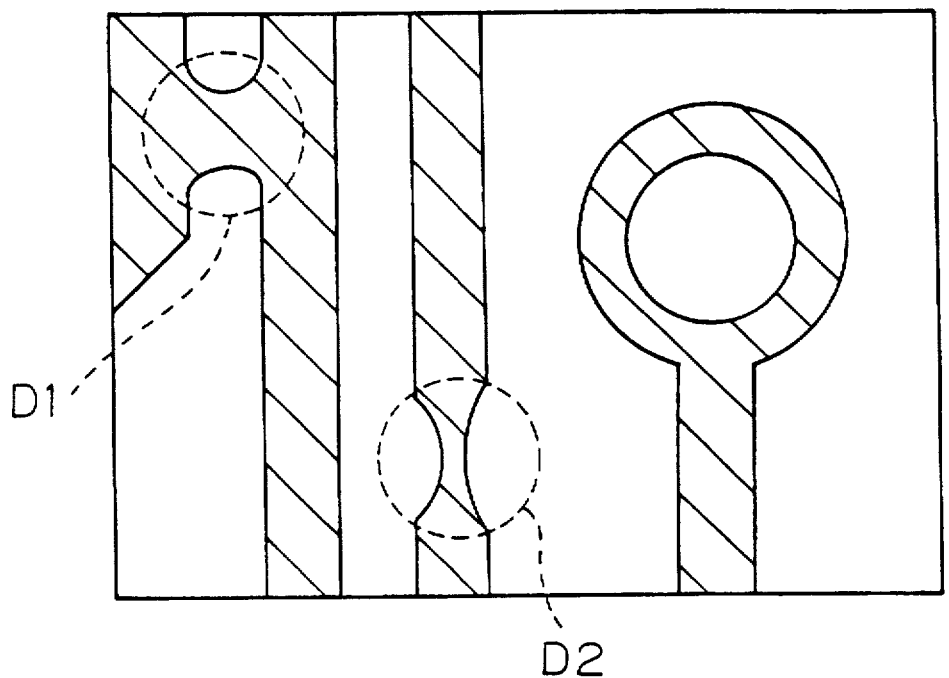
FIG. 14A and FIG. 14B are explanatory diagrams for describing correction of an image of a master substrate in the preferred embodiment.
Figure 14B:
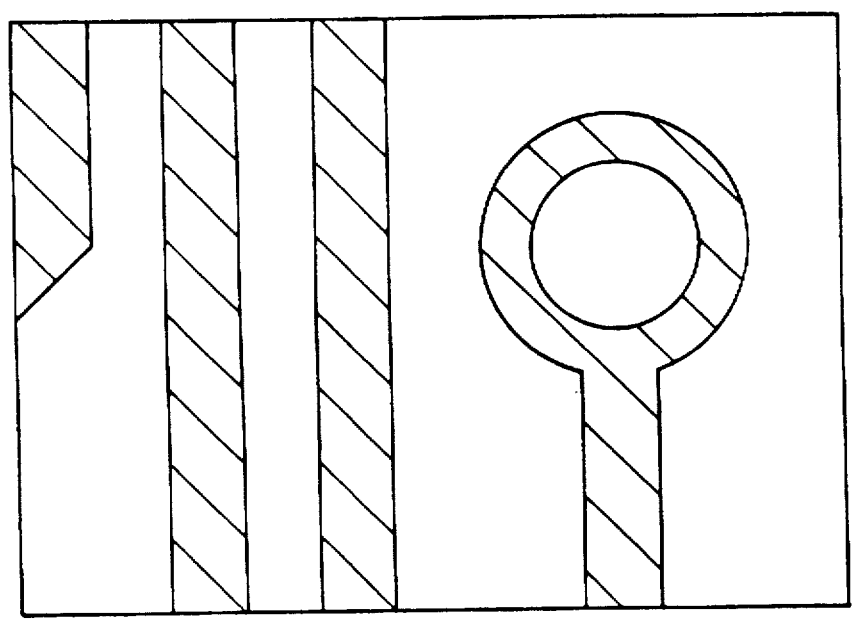

FIG. 14A shows this situation. Hatched portions in FIG. 14A and 14B are conductive pattern portions. In the illustrated example, there are short circuit defect D1 and a thinning defect D2. Using the mouse, an operator corrects these defects on the screen of monitor M1. FIG. 14B shows the result of such correction.

In the case where comparison of the images which are included in the master area MA and the object areas $OA_1$ and $OA_2$ identifies a non-coincident portion, it is possible that a pattern defect which created the defect is in the master area MA, and not in the object areas $OA_1$ and $OA_2$. However, since an operator performs final confirmation and correction of a defect while looking at the screen of the monitor M1, if the operator can not find a defect by visual examination of the image of the object area $OA_1$ ($OA_2$) which was identified as "non-coincident," a corresponding image portion within the master area MA may be displayed on the monitor M1 and the operator can confirm whether the defect is within the master area MA. If the defect is within the master area MA, the operator may correct the image of the master area MA. A monitor M2 used for displaying a real image of a defect portion.

Based on the corrected image of the entire master substrate obtained in this manner, at Step S7 (FIG. 3), a compare check is performed on other object substrates which are formed to include the same conductive patterns as those of the master substrate. Scanning and defect inspection (compare check and DRC inspection) on the other object substrates performed at Step S7 are approximately the same as real scanning and defect inspection performed on the master substrate at Step S4 of FIG. 3. Differences are (a) that similar to the pre-scanning performed at Step S1, scanning of the other object substrates at Step S7 is parallel scanning of each entire object substrate whereas the real scanning and the defect inspection on the master substrate are performed area by area, and (b) that the image of each entire object substrate is compared with the entire master image as it is after correction whereas for the master substrate, the master area MA is compared with each one of the object areas $OA_1$ and $OA_2$.

In accordance with a judgement made at Step S8 (FIG. 3), the processing at Step S7 is performed on all the other object substrates, thereby completing the entire processing.

Through the series of the processes, a defect which is included in the image of the master substrate is corrected in accordance with comparison between areas of the master substrate so that a proper master image is obtained, and since the proper master image is compared with other object substrates, the accuracy of compare check on the other object substrates is improved.

3. Modification Although the preferred embodiment described above requires selecting one row of a multiple of printed patterns as the master area MA, a portion of one row (e.g., only the unit pattern $P_{11}$) may be used as the master area. Alternatively, a plurality of rows may be used as the master area.

However, since patterns on a object substrate are a matrix arrangement of the unit patterns, as in the preferred embodiment described above, when the object substrate is read while moving the one-dimensional image reading apparatus relative to the object substrate, the processing is performed more efficiently if one row of the unit patterns is used as the master area. That is, since image information is obtained for each row of the unit patterns during scanning and reading as described above, if only the unit pattern $P_{11}$, for example, is defined as the master area, it is necessary to separate only the first one of the three unit patterns $P_{11}$, $P_{12}$ and $P_{13}$ which are included in the first row, i.e., the unit pattern $P_{11}$, as the master area. It is also necessary to store the other two unit patterns $P_{12}$ and $P_{13}$ and the unit patterns $P_{21}$ to $P_{33}$ of the remaining rows as object patterns. In contrast, when one row is defined as the master area, as in the preferred embodiment described above, it is not necessary to separate or re-organize the unit patterns on an image signal memory, and hence, the efficiency of processing data is improved.

The present invention is applicable to a object substrate in which a plurality of unit patterns are formed. Also, the present invention does not necessarily require that a number of unit patterns be arranged in a matrix.

Although the preferred embodiment described above uses a mouse as "designating means," i.e., "means for designating at least one of a plurality of unit pattern images" such information may be designated and inputted automatically. In other words, when a particular mark or the like which can serve as a positional reference is formed in a reference object, the particular mark may be specified by means of image recognition and an area which has a predetermined position of the particular mark may be defined as the "reference pattern image," whereby automation is realized. This is also true with object patterns. When the particular mark is two-dimensional, if an object is inclined, it is possible to recognize even the inclination of the object. Hence, inputting of a position for correction of inclination as in the preferred embodiment is also done automatically.

Therefore, the "designating means" used in the present invention includes both manual inputting means and automatic inputting means.

Further, the present invention is applicable not only to an inspection apparatus for inspecting a printed wire board, but is also applicable pattern inspection for an IC mask pattern, a lead frame, a liquid crystal display substrate, etc.

While the invention has been described in detail, the foregoing description is in all aspects illustrative and not restrictive. It is understood that numerous other modifications and variations can be devised without departing from the scope of the invention.

We claim:
1. A method of inspecting pattern defects of an object on which a plurality of unit patterns are arrayed, said method comprising the steps of:
   a) reading said plurality of unit patterns to obtain a plurality of unit pattern images;
   b) designating at least one of said plurality of unit pattern images to obtain:
   a reference image including said at least one of said plurality of unit pattern images, and
   an object image including unit pattern images other than said reference image among said plurality of unit pattern images; and
   c) comparing said object image with said reference image to inspect said object for pattern defects;
   step c) includes the steps of:
      c-1) designating a master reference point in said reference image;
      c-2) determining an objective reference point in said object image corresponding to said master reference point;
      c-3) shifting said object image in position by a positional difference between said master reference position and said object reference position to obtain a shifted object image; and
      c-4) comparing said shifted object image with said reference image to inspect said object for pattern defects;

step c-1) includes the steps of:
- c-1-1) displaying said reference image; and
- c-1-2) designating said master reference point in said reference image displayed;

step of c-2) includes the steps of:
- c-2-1) displaying said object image so as to overlap said reference image displayed; and
- c-2-2) determining said objective reference point in said object image so as to coincide with said master reference point in said reference image.

2. The method of claim 1, wherein the step c-2-1) includes the step of:

displaying said object image by a color different from a color of said reference image displayed.

3. The method of claim 1, wherein the step c-3) includes the step of:

- c-3-1) scanning said plurality of unit patterns while compensating said positional difference between said master reference point and said objective reference point to obtain said shifted object image.

4. The method of claim 1, wherein said plurality of unit pattern images are arrayed into a pattern matrix having a plurality of rows, and step b) includes the step of:

- b-1) designating one row among said plurality of rows to determine said reference image, and
- b-2) defining said object image by other rows among said plurality of rows.

5. The method of claim 4, wherein said pattern matrix has at least three rows, a first end row within said at least three rows is designated as said reference image, a master reference point is designated in said first end row, an objective reference point is determined in a second end row within said at least three rows, and step c) includes the steps of:

interpolating a positional difference between said master reference point and said objective reference point to obtain interpolated distances; and compensating each positional difference between said first end row and each other rows within said at least three rows, which positional difference is obtained from said interpolated distances.

6. A method of inspecting pattern defects of first and second objects on each of which a plurality of unit patterns are formed, said method comprising the steps of:

a) reading said plurality of unit patterns on said first object to obtain a plurality of unit pattern images;

b) designating at least one of said plurality of unit pattern images to obtain:

a local reference image including said at least one of said plurality of unit pattern images, and an object image including unit pattern images other than said local reference image among said plurality of unit pattern images;

c) comparing said object image with said local reference image to inspect said first object for local pattern defects;

d) correcting a part of said plurality of unit pattern images corresponding to said local pattern defects to obtain a global reference image; and e) comparing said global reference image with an image of said second object to inspect said second object for pattern defects.

7. An apparatus for inspecting pattern defects of an object on which a plurality of unit patterns are arrayed, said apparatus comprising:

a) reading means reading said plurality of unit patterns to obtain a plurality of unit pattern images;

b) designating means designating at least one of said plurality of unit pattern images to obtain:

a reference image including said at least one of said plurality of unit pattern images, and an object image including unit pattern images other than said reference image among said plurality of unit pattern images; and c) comparing means comparing said object image with said reference image to inspect said pattern defects of said object;

said comparing means includes:

- c-1) means designating a master reference point in said reference image;
- c-2) means determining an objective reference point in said object image corresponding to said master reference point;
- c-3) means shifting said object image in position by a positional difference between said master reference position and said object reference position to obtain a shifted object image; and
- c-4) means comparing said shifted object image with said reference image to inspect said object for pattern defects;

said means c-1) includes:

display means;

first control means displaying said reference image on said display means; and means designating said master reference point in said reference image displayed;

said means c-2) includes:

second control means displaying said object image so as to overlap said reference image displayed on said display means, and said objective reference point is determined in said object image so as to coincide with said master reference point in said reference image.

8. The apparatus of claim 7, wherein said display means is operable to display said object image by a color different from a color of said reference image.

9. The apparatus of claim 7, wherein said means c-3) includes:

means scanning said plurality of unit patterns while compensating said positional difference between said master reference point and said objective reference point to obtain said shifted object image.

10. The apparatus of claim 7, wherein said plurality of unit pattern images are arrayed into a pattern matrix having a plurality of rows, and one row among said plurality of rows is designated as said reference image, and said object image is defined by other rows among said plurality of rows.

11. The apparatus of claim 10, wherein said pattern matrix has at least three rows, a first end row within said at least three rows is designated as said reference image, a master reference point is designated in said first end row, an objective reference point is determined in a second end row within said at least three rows, and said comparing means includes:

means interpolating a positional difference between said master reference point and said objective reference point to obtain interpolated distances; and means for compensating each positional difference between said first end row and each other rows within said at least three rows, which positional difference is obtained from said interpolated distances.

12. An apparatus for inspecting pattern defects of first and second objects on each of which a plurality of unit patterns are formed, said apparatus comprising:

a) reading means reading said plurality of unit patterns on said first object to obtain a plurality of unit pattern images;

b) designating means designating at least one of said plurality of unit pattern images to obtain:

a local reference image including said at least one of said plurality of unit pattern images, and an object image including unit pattern images other than said local reference image among said plurality of unit pattern images;

c) first comparing means comparing said object image with said local reference image to inspect local pattern defects of said first object;

d) correcting means inputting a signal for correcting part of said plurality of unit pattern images corresponding to said local pattern defects to obtain a global reference image; and e) second comparing means comparing said global reference image with an image of said second object to inspect pattern defects of said second object.

* * * * *